United States Patent
Fujii et al.

(10) Patent No.: US 6,240,931 B1
(45) Date of Patent: *Jun. 5, 2001

(54) METHOD FOR REMOVING PARTICLES FROM A SURFACE OF AN ARTICLE

(75) Inventors: Toshiaki Fujii, Kanagawa-ken; Kikuo Okuyama; Manabu Shimada, both of Hiroshima-ken, all of (JP)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/963,685

(22) Filed: Nov. 4, 1997

(30) Foreign Application Priority Data

Nov. 5, 1996 (JP) .................................................. 8-307507
Jul. 18, 1997 (JP) .................................................. 9-208412

(51) Int. Cl.[7] ................................ B08B 3/12; B08B 6/00
(52) U.S. Cl. .................................... 134/1; 134/1.3; 134/2; 134/21; 134/902
(58) Field of Search ........................ 134/1, 1.3, 2, 902, 134/21

(56) References Cited

U.S. PATENT DOCUMENTS

| | | | |
|---|---|---|---|
| 4,000,990 | 1/1977 | Bingham | 55/30 |
| 4,153,429 | 5/1979 | Matthews et al. | 55/68 |
| 4,629,479 | 12/1986 | Cantoni | 55/274 |
| 4,655,049 | 4/1987 | Andrews et al. | 62/172 |
| 4,741,882 | 5/1988 | Weichselgartner | 422/122 |
| 4,750,917 | 6/1988 | Fujii | 55/6 |
| 5,039,321 | 8/1991 | Satoh et al. | 55/259 |
| 5,042,997 | 8/1991 | Rhodes | 55/126 |
| 5,080,699 | 1/1992 | Ho et al. | 55/179 |
| 5,154,733 | * 10/1992 | Fujii et al. | 55/2 |
| 5,221,520 | 6/1993 | Cornwell | 422/122 |
| 5,225,000 | 7/1993 | Fujii et al. | 134/1 |
| 5,296,018 | 3/1994 | Suzuki | 95/65 |
| 5,399,319 | 3/1995 | Schoenberger et al. | 422/121 |
| 5,410,122 | * 4/1995 | Su et al. | 219/121.44 |
| 5,858,108 | * 1/1999 | Hwang | 134/1.3 |

FOREIGN PATENT DOCUMENTS

| | | |
|---|---|---|
| 61-178050 | 8/1986 | (JP) . |
| 4-171061 | 6/1992 | (JP) . |
| 4-239131 | * 8/1992 | (JP) . |
| 4-243540 | * 8/1992 | (JP) . |
| 5-68875 | * 3/1993 | (JP) . |
| 6-296944 | * 10/1994 | (JP) . |
| 7-93098 | * 10/1995 | (JP) . |

OTHER PUBLICATIONS

Derwent Abstracts, DE 3703317, Aug. 18, 1988.

Manabu Shimada, et al., Society of Chemical Engineering, pp. 233–234 (with English translation), Abstract for Okayama Conference, published on Jul. 23, 1997.

Yoshio Otani, et al., Japan Association of Aerosol Science and Technology, The 13th Symposium on Aerosol Science & Technology, Aug. 21 to 23, pp. 215–217, with English Abstract, "Resuspention Mechanism of Particle From Water Surface by Pulse Air Jet".

* cited by examiner

*Primary Examiner*—Zeinab El-Arini
(74) *Attorney, Agent, or Firm*—Oblon, Spivak, McClelland, Maier & Neustadt, P.C.

(57) ABSTRACT

A method for removing particles from a surface of an article, such as a semiconductor wafer in a clean room. The particles are supplied with an electric charge. Subsequently, an ultrasonic wave or a gas stream is applied onto the surface of the article while an electric field is applied for driving away the electrically charged particles from the surface, thereby removing particles having a dimension smaller than 1 micrometer from the surface. The presence of a collecting member allows the removal of resulting, floating particles.

18 Claims, 5 Drawing Sheets

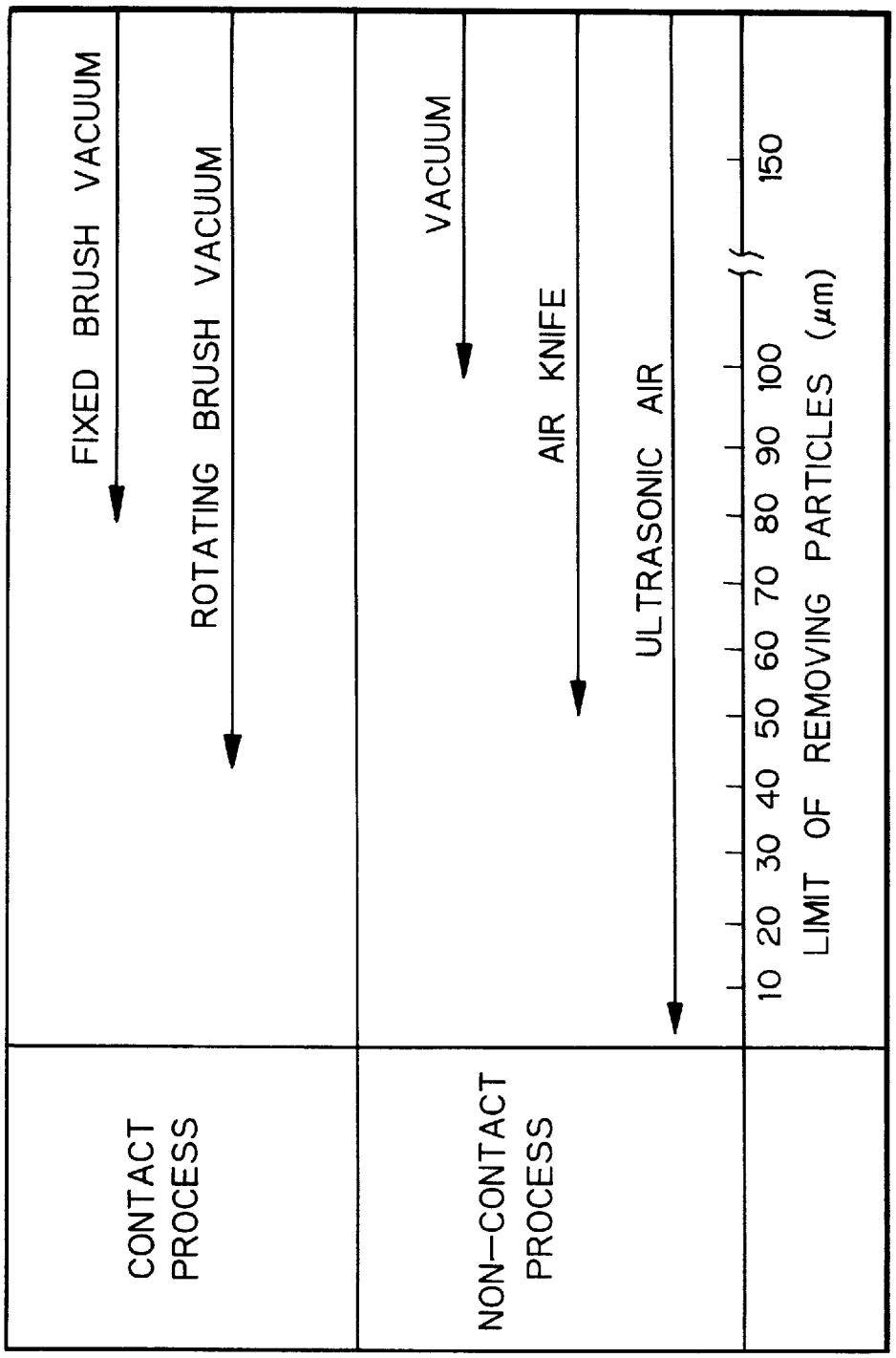

METHOD FOR REMOVING PARTICLES FROM A SURFACE OF AN ARTICLE

BACKGROUND OF THE INVENTION

The present invention relates to a method and an apparatus for removing particles from a surface of an article, such as a semiconductor wafer in a clean room, a reactor for coating a surface of a semiconductor device and its peripheral equipment, and a glass for liquid crystal.

A clean room is used to produce semiconductor devices and like, and is required to be free of particles such as dust so as to provide a surface of a semiconductor wafer free of particles. Recently, it has been required, for example, to remove particles from a semiconductor wafer having a dimension as small as several micrometers and preferably particles having a dimension smaller than one micrometer.

A conventional method for cleaning particles from a surface of an article includes a contact process and a non-contact process, as shown in FIG. 8. The contact process includes a fixed brush vacuum process and a rotating brush vacuum process. Both of the contact processes allow the removal of particles having a dimension of not less than scores of micrometers, but does not remove particles having a dimension of up to scores of micrometers.

The non-contact process includes a vacuum process, an air knife process, and a ultrasonic air process. The vacuum process removes particles having a dimension of not less than about 100 micrometers, and the air knife process does not enable the removal of particles having a dimension of not more than scores of micrometers. The ultrasonic air process allows the removal of particles having a dimension as small as several micrometers. However, the ultrasonic air process does not enable the removal of particles having a dimension of not more than 1 micrometer.

The present inventors have proposed removing particles from a wafer by irradiation with an ultraviolet ray, a radiation ray and a laser ray onto a wafer, thereby emitting a photoelectron therefrom so as to remove the articles therefrom (please refer to JP-A-4-239,131 and JP-A-6-296,944). However, a surface of a wafer is directly irradiated by an ultraviolet ray, a laser ray, or a radiation ray in this process. Therefore, if a surface of the wafer is sensitive to these rays, the wafer surface may undergo an unfavorable chemical reaction, thereby limiting its application.

SUMMARY OF THE INVENTION

In view of the foregoing, it is an object of the present invention to provide a method and an apparatus for removing particles from a surface of an article, which allows the removal of even particles having a dimension of less than one micrometer.

According to one aspect of the present invention, there is provided a method for removing particles from a surface of an article comprising: supplying the particles with an electric charge; and applying at least one of an ultrasonic wave and a gas stream onto the surface of the article while applying a first electric field for driving away the electrically charged particles from the surface of the article. Electrostatic force driven by the first electric field along with the application of an ultrasonic wave and/or gas facilitates the removal of the particles from the surface.

Preferably, the supplying step comprises bombarding the surface of the article with at least one of electrons and negatively charged ions so as to negatively charge the particles.

The supplying step may comprise the step of irradiating at least one of an ultraviolet ray and a radiation ray onto a photoelectron emitting material in the presence of at least 1 part per million of one of gaseous oxygen and water so as to produce a negatively charged ion. The supplying step may further comprise the step of applying a second electric field for driving the negatively charged ion in a direction toward the surface of the article, whereby the negatively charged ion interacts with the particles so as to supply them with an electric charge. Alternatively, convection generated by the irradiation of the ultraviolet ray carries the negatively charged ions to the particles on the surface of the article.

Preferably, the supplying step comprises the step of conducting electric discharge to produce a negatively charged ion.

Preferably, the supplying step may further comprise the step of applying a second electric field for driving the negatively charged ion in a direction toward the surface of the article, whereby the negatively charged ion interacts with the particles so as to supply the particles with an electric charge. Alternatively, convection generated by the irradiation of the ultraviolet ray carries the negatively charged ions to the particles on the surface of the article.

Preferably, the method further comprises the step of collecting the particles removed from the surface. The collecting step may comprise the step of supplying the particles removed from the surface with at least one of electrons and negatively charged ions. The collecting step may comprise the steps of: irradiating at least one of an ultraviolet ray and a radiation ray onto the photoelectron emitting material in the presence of at least 1part per million of one of gaseous oxygen and water so as to produce a negatively charged ion; and applying a second electric field for driving the negatively charged ion in a direction toward the surface of the article. Alternatively, the collecting step may comprise the step of conducting electric discharge to produce a negatively charged ion.

Preferably, particles having a dimension of not more than 5 micrometers are removed from the surface of the article. Further preferably, particles having a dimension of not more than 1 micrometer are removed from the surface of the article. Preferably, the particles have a dimension of at least 0.1 micrometer.

Preferably, the article comprises a semiconductor wafer being disposed above a first electrode. Preferably, the article comprises a semiconductor wafer standing and being close to a first electrode.

Preferably, the first electric field ranges from 10 volts to 100 kilovolts per centimeter. Preferably, the second electric field ranges from 0.1 volts to 2 kilovolts per centimeter. Preferably, the second electric field ranges from 10 volt to 1 kilovolts per centimeter.

According to another aspect of the present invention, there is provided an apparatus for removing a particle from a surface of an article comprising: an ionizing device for supplying particles on a surface of an article with an electric charge; at least one of an ultrasonic generator for applying an ultrasonic wave to a surface of an article and a stream source for generating a gas stream onto a surface of an article; and a first electrode for forming an electric field for driving electrically charged particles from a surface of an article.

Preferably, the ultrasonic generator comprises at least one of a piezoelectric oscillator, a polymer piezoelectric membrane, an electrostrictive oscillator, a Langevin oscillator, a magnetostrictive oscillator, an electrodynamic transformer, and a capacitor transformer. Further preferably, the ultrasonic generator comprises a piezoelectric oscillator.

Preferably, the stream source comprises an air knife.

Preferably, the ionizing device comprises a photoelectron emitting material and a light source for irradiating at least one of an ultraviolet ray and a radiation ray onto the photoelectron emitting material.

Preferably, the ionizing device is capable of conducting electric discharge. Preferably, the ionizing device comprises a pair of second electrodes wherein electricity passes through a gas between the second electrodes. Preferably, the ionizing device comprises a heater for generating convection.

Preferably, an apparatus further comprises a trap for collecting a particle removed from an article. The trap may comprise a third electrode for trapping particles removed from an article.

BRIEF DESCRIPTION OF THE DRAWINGS

FIG. 8 is a graph showing a limit of removable particle size in micrometers.

PREFERRED EMBODIMENTS OF THE INVENTION

Figure 1:
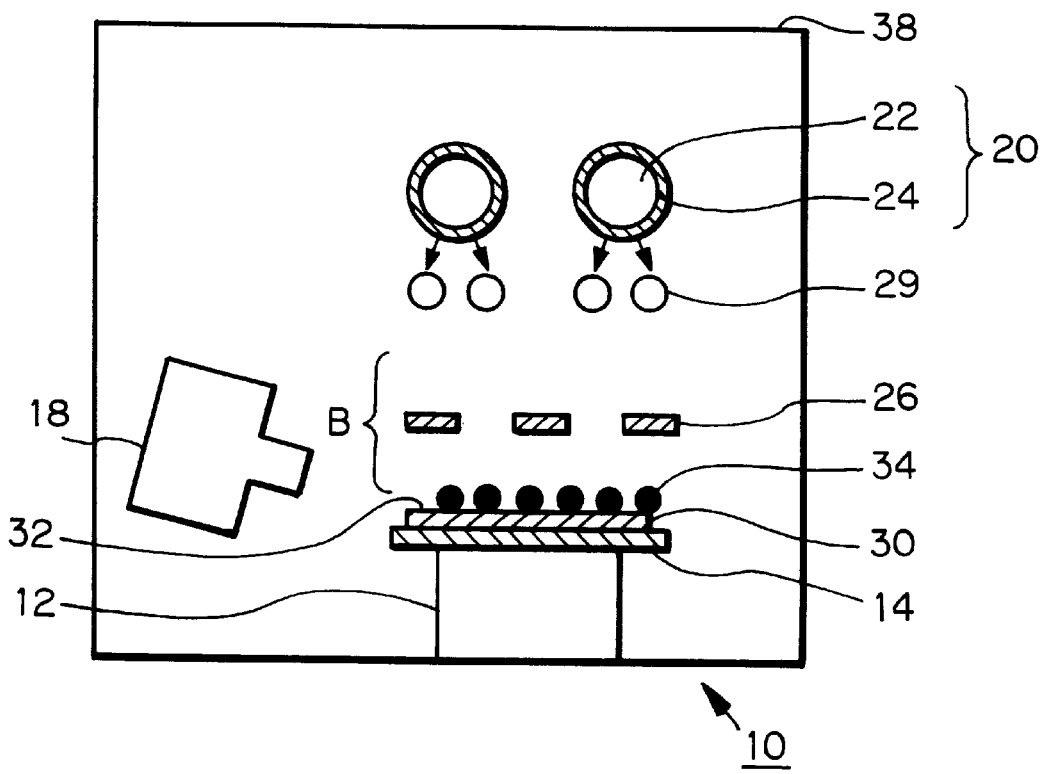
FIG. 1 is a schematic view of one embodiment in accordance with the present invention.

In the present invention, particles present on a surface of an article are supplied with electric charge. The surface of the article may be bombarded with electrons and/or negatively charged ions so as to negatively charge the particles.

In the present invention, photoelectrons may be used to supply particles on a surface of an article with an electric charge. Alternatively, electric discharge may be used to supply the particles with an electric charge. Similarly, photoelectrons and electric discharge may be used to supply particles removed from the surface of the article with an electric charge so as to facilitate trapping thereof.

In the present invention, any photoelectron emitting material that emits photoelectrons upon exposure to an ultraviolet ray and/or a radiation ray may be used. Preferably, the photoelectron emitting material may have a small work function for producing a photoelectron. From the view point of efficiency and cost, the material may be made of at least one of Ba, Sr, Ca, Y, Gd, La, Ce, Nd, Th, Pr, Be, Zr, Fe, Ni, Zn, Cu, Ag, Pt, Cd, Pb, Al, C, Mg, Au, In, Bi, Nb, Si, Ti, Ta, U, B, Eu, Sn, P and W or any compound or alloy containing these elements or any combination thereof. These material may be used either on their own or as an admixture. A composite of these materials may be used such as an amalgam.

Compounds that can be used for the photoelectron emitting materials include, oxides, borides, and carbides. Exemplary oxides include $BaO$, $SrO$, $CaO$, $Y_2O_3$, $Cd_2O_3$, $Nd_2O_3$, $ThO_2$, $ZrO_2$, $Fe_2O_3$, $ZnO$, $CuO$, $Ag_2O$, $La_2O_3$, $PtO$, $PbO$, $Al_2O_3$, $MgO$, $In_2O_3$, $BiO$, $NbO$, and $BeO$. Exemplary borides include $YB_6$, $CdB_6$, $LaB_5$, $NdB_6$, $CeB_6$, $EuB_6$, $PrB_6$ and $ZrB_2$. Exemplary carbides include $UC$, $ZrC$, $TaC$, $TiC$, $NbC$, and $WC$.

Alloys that can be used for the photoelectron emitting materials include brass, bronze, phosphor bronze, alloys of Ag and Mg(2 to 20 percent by weight of Mg), alloys of Cu and Be(1 to 10 percent by weight of Be) and alloys of Ba and Al. Alloys of Ag—Mg, Cu—Be and Ba—Al systems are preferred. The oxides can be obtained by either heating a metal surface in air for oxidation or oxidizing the metal surface with chemicals.

Another method that can be adopted is to heat the metal surface prior to use so as to form a stable oxide layer thereon. For example, an alloy of Mg and Ag is heated in water vapor at a temperature ranging from 300 to 400° C. so as to form an oxide film thereon. The oxide film remains stable for a long period of time.

JP-B-7-93098 discloses a thin film of Au, which serves as the photoelectron emitting material, coated onto a quartz glass serving as a matrix. The quartz glass transmits an ultraviolet ray. The disclosure of JP-B-93098 is incorporated herein as reference. As proposed in JP-A-5-68875, electrical conductor may be incorporated along with the photoelectron emitting material to a matrix. The disclosure of JP-A-5-68875 is incorporated herein as reference.

The photoelectron emitting material may be used in various configurations including a bar or rod shape, a linear shape, a fiber shape, a grid shape, a plate shape, a plated shape, a curved shape, a cylindrical shape, a screen shape. Preferably, shapes provide a large area for exposed to an ultraviolet ray or a radiation ray. As disclosed in JP-A-4-243540, the photoelectron emitting material may be coated onto a surface of an ultraviolet-ray source such as an ultraviolet lamp and/or a surface of its vicinity. The configuration in use may be determined, depending on application, the shape and the structure of an apparatus, and so on.

The radiation source for emitting photoelectrons from the photoelectron emitting materials is not limited, provided that the radiation source generates, upon irradiation, photoelectrons from the photoelectron emitting material. The radiation source includes an ultraviolet ray, a radiation ray, electromagnetic waves, and a laser, and can be selected in view of an area of application, a size of an apparatus, a shape and effects. In view of effects and smooth operations, usually an ultraviolet ray and/or a radiation ray are preferable.

A type of the ultraviolet ray is not limited, provided that the radiation source generates, upon irradiation, photoelectrons from the photoelectron emitting material. A source of the ultraviolet ray can be selected in view of an area of application, the shape and the structure of the apparatus, its operations, cost and the like. For example, the source of the ultraviolet ray includes mercury lamps, hydrogen discharge tubes, xenon discharge tubes and Lyman discharge tubes. Moreover, sterilizing lamps, chemical lamps, black lamps, and fluorescent chemical lamps may be used.

A radiation ray is not limited provided that the irradiation thereof emits photoelectrons from the photoelectron emitting material. Conventional process of generating the radiation ray can be used. Preferably, the radiation ray has a sterilizing action. For example, $^{137}Ce$, $^{60}Co$, both of which have sterilizing actions, are preferably used as a source of radiation ray. A source of the radiation ray can be selected in view of an area of application, its operations, cost and the like.

The radiation ray include, for example, an alpha rya, a beta ray, and a gamma ray. The source of the radiation ray includes radioactive isotopes such as cobalt 60, cesium 137, strontium 90; radioactive wastes produced in a nuclear reactor; radioactive materials produced by suitably treating the radioactive wastes; the nuclear reactor itself; a particle accelerator such as electron accelerator, etc.

Electrode is explained hereinafter. Electrodes may be used for emitting photoelectrons, accelerating the photoelectrons, removing charged particles from a surface of an article, and trapping floating particles removed from the surface. An independent electrode may be used for each of the purposes. Alternatively, the same electrode may be shared for any combination of the purposes.

Preferably, an electric field is formed between the photoelectron emitting materials serving as a cathode and an electrode serving as an anode for driving the photoelectrons from the photoelectron emitting materials to the electrode. The electric field facilitates emission of photoelectrons from the photoelectron emitting material also. The electrode for the anode may be disposed close to the article so that photoelectrons are bombarded into the surface of the article where particles are present. The electric field may range from 0.1 volt per centimeter to 2 kilovolts per centimeter.

The photoelectrons may interact with gaseous oxygen and water to produce negatively charged ions. The electric field drives the negatively charged ions along with the photoelectrons in a direction to the anode. The negatively charged ions and the photoelectrons interact with the particle so as to supply the particles with an electric charge.

The electrodes may be made of any conductive materials, which include, for example, tungsten, stainless steel, an alloy made of Cu and Zn. The electrode may have a configuration of a bar, a line, a grid, a plate, a pleated plate, a curved surface, a cylindrical shape, a net, etc. The presence or absence of the electric field, the strength thereof, materials and shape of the electrode, may depend on an area of application, a type and structure of an apparatus, required performance, and may be selected upon a preliminary test.

Alternatively, in the present invention, electric discharge can be used to supply the particles with an electric charge. The electric discharge can be used to supply particles removed from the surface of the article with an electric charge so as to facilitate trapping thereof.

In the present specification, the electric discharge refers to a passage of electricity through a gas. The electric discharge may include corona discharge, glow discharge, arc discharge, spark discharge, creeping discharge, pulse discharge, high frequency discharge, laser discharge, trigger discharge, plasma discharge and so on. A conventional method for generating the electric discharge can be used in the present invention.

The creeping discharge and the pulse discharge provide an increased concentration of ions, thereby making the apparatus smaller. The features are preferable in some applications. The corona discharge is simple, easy to operate and effective. Therefore, corona discharge is preferable in other applications.

In generating electric discharge, in general, it is preferable to generate negatively charged ions to positively charged ions since negatively charged ions tends to move further than positively charged ions.

When the presence of an ozone gas is preferable, the negatively charged ions may be produced by electric discharge, such as the corona discharge. The negatively charged ions tends to produce the ozone gas more than the positively charged ions. A surface of an article may have an organic matter, which may or may not be particles, and the presence of the ozone gas oxidizes the organic matter to decompose thereof. Therefore, organic matter and other particles may be removed simultaneously.

In contrast, when the presence of the ozone gas is not preferably, positively charged ions may be produced by electric discharge.

A discharge electrode and a complimentary electrode for electric discharge may be made of a conventional material and have a conventional configuration. The configuration includes a needle shape, a plate shape, a grid shape, a line shape, a sphere shape, a corrugated shape, a pleated shape, a comb-like shape and so on.

In general, a voltage ranging from 1 kilovolt to 80 kilovolts is applied to generate corona discharge.

In the present invention, at least one of an ultrasonic wave and a gas stream onto the surface of the article is applied while an electric field is applied for driving away the electrically charged particles from the surface of the article, thereby efficiently removing particles from the surface of the article. The article may be a semiconductor wafer in a clean room, a reactor for coating a surface of a semiconductor device and its peripheral equipment, and a glass for liquid crystal. The reactor may be made of aluminum or stainless steel.

Typically, a pair of electrodes may be used for forming an electric field for driving away the electrically charged from the surface of the article. The anode for driving the photoelectrons from the photoelectron emitting materials serving as a cathode may be converted to a cathode for driving away the electrically charged particles from the surface of the article. The cathode for driving away the electrically charged particles may be disposed on the opposite side of the surface of the article with respect to particles. The complimentary anode for driving away the electrically charged particles may be independently disposed in the same side of the surface of the article with respect to the particles. Alternatively, the complimentary cathode may be the photoelectron emitting materials.

The electrode for driving away the electrically charged particles from a surface of an article are not limited as long as the electrodes are capable of forming an electric field. The electrode may be made of any conductive material such as a Cu—Zn alloy, stainless steel, tungsten. The configuration of the electrode may include a linear shape, a bar shape, a net shape, a grit shape, a plate shape and so on.

The electric field for driving away the electrically charged particles from the surface of the article may range from 10 volts to 100 kilovolts per centimeter, and preferably range from 0.1 volts to 2 kilovolts per centimeter. A suitable strength for the electric field depends on the configuration and properties of a surface of an article where particles are present, chemical composition and an amount of electric charge of the particles , and a preliminary test may be conducted to determine the strength of the electric field.

In the present invention, the formation of the electric field along with particles electrically charged facilitate the removal of the particles. Electrostatic force driven by the electric field facilitate the removal of the particles from the surface. The application of an ultrasonic wave and/or gas further facilitate the removal.

In the method in accordance with the present invention, an ultrasonic wave and/or a gas stream is applied onto the surface of the article. The ultrasonic wave may range from 1 kKz to 5,000 kHz, and preferably from 10 kHz to 300 kHz. The ultrasonic wave may be generated by an ultrasonic generator.

A gas stream may be applied by an air knife. The gas stream refers to a flow of a pressurized gas at a high speed. For example, a particle-free air, a particle-free inert gas such as a nitrogen gas may be used.

The apparatus in accordance with the present invention has an ultrasonic generator for applying an ultrasonic wave to a surface of an article and/or a stream source for generating a gas stream onto a surface of an article. The ultrasonic generator may include a piezoelectric oscillator, a polymer piezoelectric membrane, an electrostrictive oscillator, a Langevin oscillator, a magnetostrictive oscillator, an electrodynamic transformer, and a capacitor transformer. Preferably, the ultrasonic generator may include a piezoelectric oscillator. The stream source may include an air knife.

In the present invention, both the ultrasonic wave and the gas stream may be applied to a surface of an article. Alternatively, either the ultrasonic wave or the gas stream may be applied to a surface of an article. When the particles have smaller diameters, the application of both the ultrasonic wave and the gas stream is particularly effective for removing particles. Conditions for removing electrically charged particles, which include the presence or absence of the combination, frequency of ultrasonic waves and a process for producing the same, the pressure and speed of the gas stream and so on, depend on the apparatus, a type and size of particle, type and configuration of a surface where the particle is present, the strength of electric field, the size and configuration of the apparatus, performance required and so on. Preferably, the conditions of removing the electrically charged particles may be determined by a preliminary test.

In the present invention, preferably, the particles removed from the surface of the article may be collected so as to prevent an ambient atmosphere from being contaminated. The particles removed are electrically charged as explained above, and the trap which is charged with an opposite electric charge may be disposed above the article. For example, when the particles are negatively charged, the trap may be positively charged, and the trap may be an electrode serving as an anode. When the particles removed have a small diameter or an electric charge thereon is not sufficient, the particles removed may be supplied with a further electric charge by way of photoelectrons or electric discharge, as explained above. The process including the steps of: supplying the removed particles with photoelectrons and trapping them by the trapping member is disclosed in the aforementioned documents, as well as "Aerosol Study" vol. 8, issue 3, pages 239–248, 1993; "Clean Technology" vol. 8, issue 7, pages 63–67, 1995.

The trap for charged particles can be of any suitable type. Examples include dust collecting plates, various electrode for collecting dust, and electrostatic filter. The trap further includes a woolly structure, which serves as an electrode itself, for example, a steel wool electrode and a tungsten wool electrode. Electret assemblies can also be used.

Dust collecting plates, electrodes for collecting dust, and electrodes having a woolly structure such as steel wool electrode and tungsten wool electrode are preferable since they are capable of trapping the removed, floating particles and of forming an electric field for supplying the removed, floating particles with electric charge.

When the electric field is applied to trap the removed, floating particles, the electric field ranges from 10 volt to 1 kilovolts per centimeter.

EXAMPLES

The present invention is explained hereinafter by way of example. However, the following examples are illustrative and not limit the present invention Example 1

FIG. 1 is a schematic view of an apparatus 10 of the present invention in a clean room.

The apparatus 10 is disposed in a chamber 38, which in turn is disposed in a clean room. The apparatus 10 has a support 12 for supporting an electrode 14 and the electrode 14, which may have a plate configuration. The electrode 14 may serve as a bed for mounting a wafer 30 having a plate configuration. Alternatively, a wafer may be held and stood in a rack in generally transverse directions. The wafer 30 has a surface 32, and a plurality of particles 34 are present on the surface 32.

An apparatus 10 has a device 20 for emitting a photoelectron 29 toward the electrode 14. The device 20 has an ultraviolet lamp 22, and a coating 24 on a surface of the ultraviolet lamp. The coating 24 is made of a photoelectron emitting material. The material is typically electrically conductive, and the coating 24 may serve as one of electrodes for forming an electric field for driving a photoelectron. U.S. Pat. No. 4,750,917 and U.S. Pat. No. 5,225,000 disclose irradiating a photoelectron emitting material with an ultraviolet ray and/or a radiation ray and supplying particles in a gas with electric charge. The entire disclosure of both of the U.S. Patents are incorporated herein as reference.

An apparatus 10 has an ultrasonic generator 18 for applying an ultrasonic wave to particles 34 on a surface 32 of a wafer 30. The ultrasonic generator may include a piezoelectric oscillator.

Another electrode 26 for trapping particles 34 removed from a wafer 30 is disposed between the ultraviolet lamp 22 and the electrode 14. The electrode 26 may have a grid configuration and extend in directions being parallel to the wafer 30.

In a method according to the present invention, the ultraviolet lamp 22 is turned on so as to irradiate an ultraviolet ray onto the coating 24 on the ultraviolet lamp 22, thereby emitting photoelectrons 29 from the coating 24. While photoelectrons 29 are generated from the coating 24, electric current is applied to the coating 24 serving as a cathode and the electrode 12 serving as an anode so as to form an electric field for driving the photoelectrons 29 from the coating 24 to the electrode 14.During the passage, the photoelectrons 29 may interact with oxygen and water molecules in an atmosphere so as to produce negatively charged ions thereof. The negatively charged ions along with the photoelectrons 29 are driven toward the electrode 14 by the electric field. The negatively charged ions and/or photoelectrons 29 interact with particles 34 on a surface 32 of a wafer 30 so as to supply the particles with electric charge.

Subsequently, electric current is applied to the electrode 14 and electrode 26 such that the electrode 14 and electrode 26 serve as a cathode and an anode, respectively, so as to form an electric field for driving the negatively charged particles 34 from the wafer 30 to the electrode 26. Please note that the polarity of the electrode 14 is changed from an anode and a cathode. Simultaneously, the ultrasonic generator 18 applies an ultrasonic wave to particles 34 on a surface 32 of a wafer 30 so as to induce removal of the particles 34 from the surface 32 . Particles 34 are removed from the surface 32 and float over the wafer 32.

In the present invention, preferably the removed from the wafer surface 32 is removed from a gas. The electrode 26 serving as the cathode may trap the floating particles.

Preferably, the floating particles are further ionized to facilitate trapping by the anode 26. In general, larger particles are more susceptible to becoming electrically charged and to being trapped by the electrode 26 while smaller particles are less susceptible to becoming electrically charged and to being trapped. In view of the foregoing, preferably, the ultraviolet lamp 22 is turned on again so as to emit photoelectrons from the coating 24, and an electric current is applied to the coating 24 serving as a cathode and the electrode 26 serving as an anode so as to drive the photoelectrons to the space over the wafer. Therefore, the space B is rich in negatively charged ions so as to ionize the floating particles, thereby facilitating the trapping of the further ionized particles by the electrode 26.

Example 2

Figure 2:
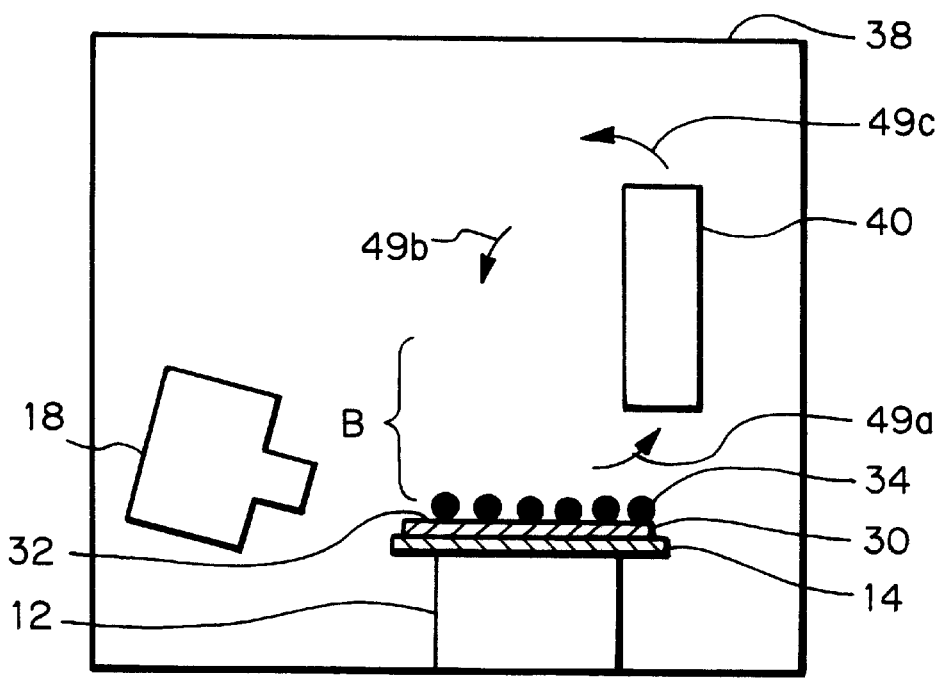
FIG. 2 is a schematic view of another embodiment in accordance with the present invention.

FIG. 2 is a schematic view of another embodiment of the present invention. The embodiment of FIG. 2 is the same as that of FIG. 1 except for an ionization device 40. The device 40 is disposed above the wafer 30.

Figure 3:
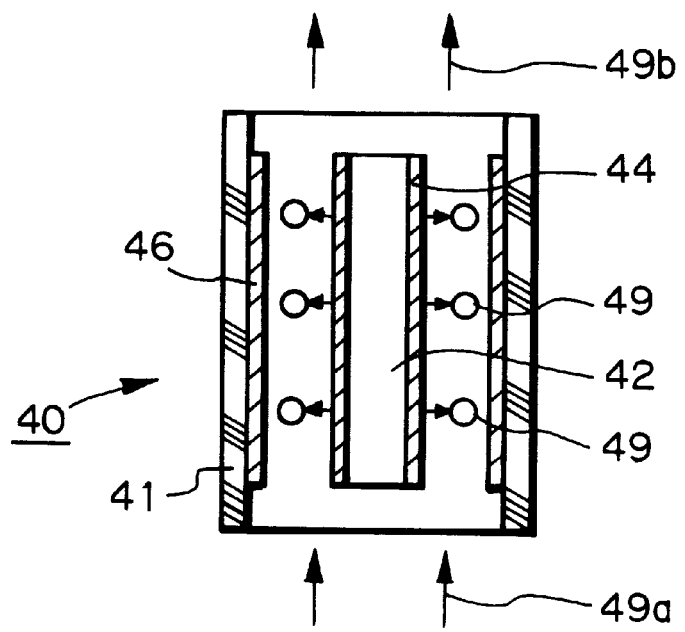
FIG. 3 is a cross section of the ionization device 40 in FIG. 2.

FIG. 3 is a cross section of the device 40. The device 40 has a housing 41 having a cylindrical configuration defining a bore extending along an axial direction. The housing 41 is preferably made of an electrical insulator. The electrical insulator may include a polymer material, preferably fluorinated polymer material and a ceramic material. The housing 41 has an electrode 46 which may have a mesh structure in a cylindrical configuration being complementary in shape to an inner surface of the housing 41.

The device 40 has an ultraviolet lamp 42 having a cylindrical configuration, which may share an axis with the housing 41. Photoelectron emitting material 44, which is electrically conductive, is coated onto a surface of the ultraviolet lamp. The housing 41 is preferably held in a vertical direction so as to facilitate an upward movement of a local air in the bore therethrough.

In FIGS. 2 and 3, upon turning on the ultraviolet lamp 42, an ultraviolet ray is irradiated onto the coating 44 so as to emit photoelectrons while an electric current is applied to the coating 44 as a cathode and the electrode 46 as an anode so as to accelerate the photoelectrons 49 in directions toward the electrode 46. Simultaneously, heat from the ultraviolet lamp 42 heats a local gas in the housing 41 so as to form convection through the bore in the housing 41. That is, the local gas in the bore moves upward through the bore in the housing 41 while the local gas carries the photoelectrons 49 upward. This convection further carries photoelectrons and resulting negatively charged ions from the device 40 to the wafer 30 so as to ionize the particles 34 on the surface 32 of the wafer.

The ultrasonic generator 18 applies an ultrasonic wave onto the surface 32 of the wafer 30 while an electric current is applied to the electrode 26 as a cathode and the electrode 46 as an anode so as to form an electric field for driving the electrically charged particles from the surface 32 of the wafer 30 to the electrode 46.

Preferably, the ultraviolet lamp 42 is turned on so as to generate the convection for carrying the particles 34 removed from the surface 32 of the wafer to the lower end of the bore of the housing 41. Simultaneously, an electric field may be formed between the coating 42 as a cathode and the electrode 64 as an anode so as to trap the particles by the electrode 46.

Example 3

The chamber 38 containing the apparatus 10 of Example 1 is disposed in a clean room of class 10, and following experiments are carried out so as to confirm removal of particles from an article. In this specification, a class refers to a number of particles having a dimension of not less than 0.1 micrometer in one square feet. The chamber has a volume of 28 liters.

A high purity silicon wafer having a diameter of five inches was used. Polystyrene latex, which may referred to PSL, standard particles having an average dimension of 0.5 and 1.0 micrometers were placed on the silicon wafer 30 in two runs, respectively.

To a surface of a bactericidal lamp of 6W was coated a gold layer having a thickness of 10 nanometers. An electric field of 300 volts per centimeter for driving photoelectrons and negatively charged ions to the wafer 30 was formed between the coating 24 serving as a cathode and the electrode 16 serving as an anode.

The ultrasonic generator 18 had a piezoelectric oscillator having 60 kHz.

A dust detector for a wafer was used to determine the number of the particles made of polystyrene latex on a surface 32 of the wafer 30.

The numbers of particles on a surface 32 of the wafer are shown in Table 1 so as to show the removal of the particles.

TABLE 1

| Run No. | | 1 | 2 | 3 | 4 | 5 |
|---|---|---|---|---|---|---|
| ionization step | | done | none | done | none | none |
| ultrasonic step | | done | done | done | done | none |
| electric field step | | done | done | none | none | none |
| particle | 0.5 μm | 18 | 750 | 650 | 800 | 850 |
| size | 1.0 μm | 15 | 800 | 650 | 900 | 950 |

In Table 1, the ionization step refers to irradiating an ultraviolet ray onto the coating 24 by the ultraviolet lamp 22 so as to emit photoelectrons 29 from the coating 24 and forming an electric field between the coating 24 and the electrode 14 for driving the photoelectrons and negatively charged ions. The ultrasonic step refers to applying an ultrasonic wave to the surface 32 of the wafer 30. The electric field step refers to forming an electric field between the electrode 14 and electrode 26 for driving charged particles 34 from the surface 32 of the wafer 30 while applying the ultrasonic wave. "Done" refers to that the step was carried out. "None" refers to that the step was not carried out. The number refers to the number of particles present on the top circular surface of the wafer having a diameter of 5 inches.

Example 4

Using the aforementioned apparatus 10 of Example 3, a further experiment was carried out for removal of floating particles originated from the particles 34 on the surface 32 of the wafer. The ionization step, the ultrasonic step and the electric field step of Example 3 were carried out in the same conditions in two runs. Polystyrene latex particles having an average dimension of 0.5 micrometers were used.

After the electric field step, in one of the runs, the ionization step was carried out again for a period of 30 minutes so as to facilitate removal of floating particles originated from the wafer surface by the electrode 26. In contrast, this ionization step was not carried out in the other run.

Subsequently, a particle-free nitrogen gas was introduced into the chamber 38 so as to purge the air therein, followed by determining the number of floating particles having a dimension of not less than 0.1 micrometers per square feet in the chamber 38 by a particle counter. The result is shown in Table 2

TABLE 2

| ionization step | the number of the particles per square feet |
|---|---|
| done | 10 |
| none | 650–700 |

Example 5

The apparatus 10 of Example 3 was used except that the ultrasonic generator 18 was replaced by an air knife for applying a gas stream onto the surface 32 of the wafer. The air knife provides a particle free $N_2$ having a purity higher than 99.9999 with a pressure of two atmospheric pressures. Polystyrene latex having a dimension of 0.5 micrometers were used as particles.

Similar to the result of Example 3, more than 80 percent of the particles were removed by the method comprising the ionization step, the air-knife step and the electric field step according to the present invention.

In contrast, in a method comprising the ionization step and the subsequent, air-knife step without carrying out the electric field step, more than 70 percent of the particles remained on the surface of the wafer.

In both runs, the particles removed from the surface were collected by the subsequent ionization step.

Example 6

Figure 4:
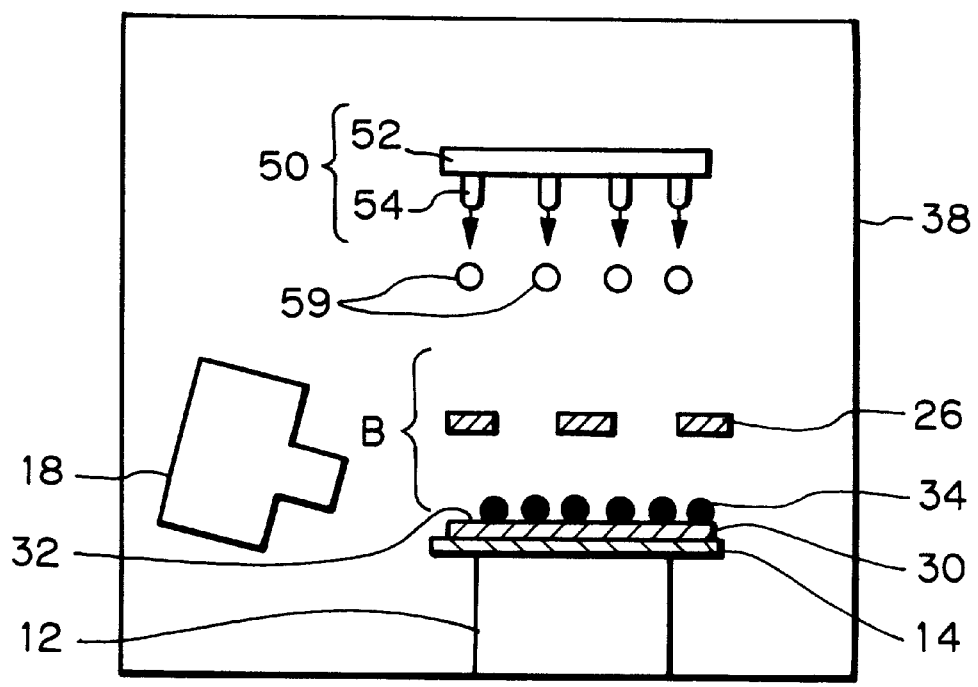
FIG. 4 is a schematic view of another embodiment in accordance with the present invention.

FIG. 4 is a schematic view of another embodiment of the present invention. The embodiment of FIG. 4 is the same as that of FIG. 1 except for an ionization device 50 for electric discharge. The ionization device 50 is disposed above the electrode 26.

The ionization device 50 has a support 52 and a plurality of needles 54 protruding from the support 52. The needles serve as discharge electrodes for corona discharge.

In this embodiment, the corona voltage is applied to the discharge electrode 54, which serve as a cathode, and the electrode 26, which serves as an anode, so as to generate a corona discharge. As a result, a plurality of negatively charged ions and electrons are generated in the vicinity of the discharge electrodes 54, and a shower of the negatively charged ions are driven in a direction toward the electrode 26 by an electric field between the cathode 54 and the anode 26. The negatively charged ions interact with the particles 34 on the surface 32 of the wafer 30 so as to supply the particles with the electric charge.

Subsequently, electric current is applied to the electrode 14 and electrode 26 such that the electrode 14 and electrode 26 serve as a cathode and an anode, respectively, so as to form an electric field for driving the negatively charged particles 34 from the wafer 30 to the electrode 26. Please note that the polarity of the electrode 14 is changed from an anode and a cathode. Simultaneously, the ultrasonic generator 18 applies an ultrasonic wave to particles 34 on a surface 32 of a wafer 30 so as to induce removal of the particles 34 from the surface 32. Particles 34 are removed from the surface 32 and float over the wafer 32.

Preferably the floating particles removed from the wafer surface 32 are further removed from a gas by the electrode 26. The floating particles may be further ionized to facilitate trapping. Specifically, the corona voltage may be applied again to the discharge electrode 54, which serve as a cathode, and the electrode 26, which serves as an anode, so as to generate a corona discharge. As a result, a plurality of negatively charged ions and electrons are generated in the vicinity of the discharge electrodes 54, and a shower of the negatively charged ions and electrons are driven in a direction toward the electrode 26 by an electric field between the cathode 54 and the anode 26. The negatively charged ions ionize the floating particles 34 over the wafer 30 so as to facilitate the trapping of the further ionized particles by the electrode 26.

Example 7

Figure 5:
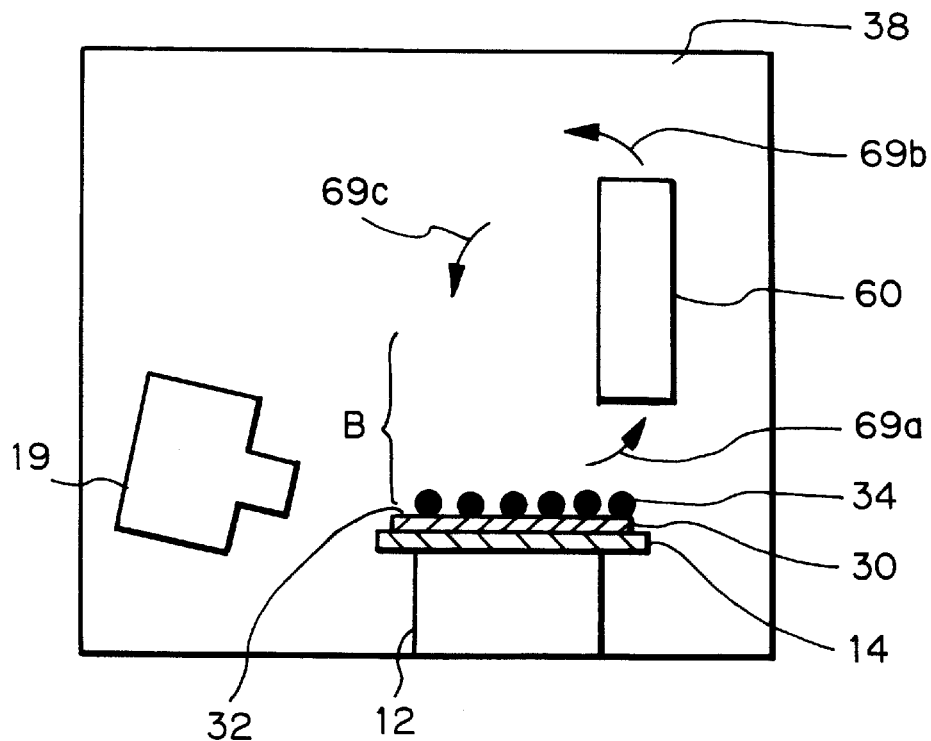
FIG. 5 is a schematic view of another embodiment in accordance with the present invention.

FIG. 5 is a schematic view of another embodiment of the present invention. The embodiment of FIG. 5 is similar to that of FIG. 2. In FIG. 5, an air knife 19, instead of the ultrasonic generator 18, is used to apply a gas stream being free of particles onto the surface 32 of the wafer 30. In FIG. 5, an ionization device 60 replaces the ionization device 40 in FIG. 2.

Figure 6:
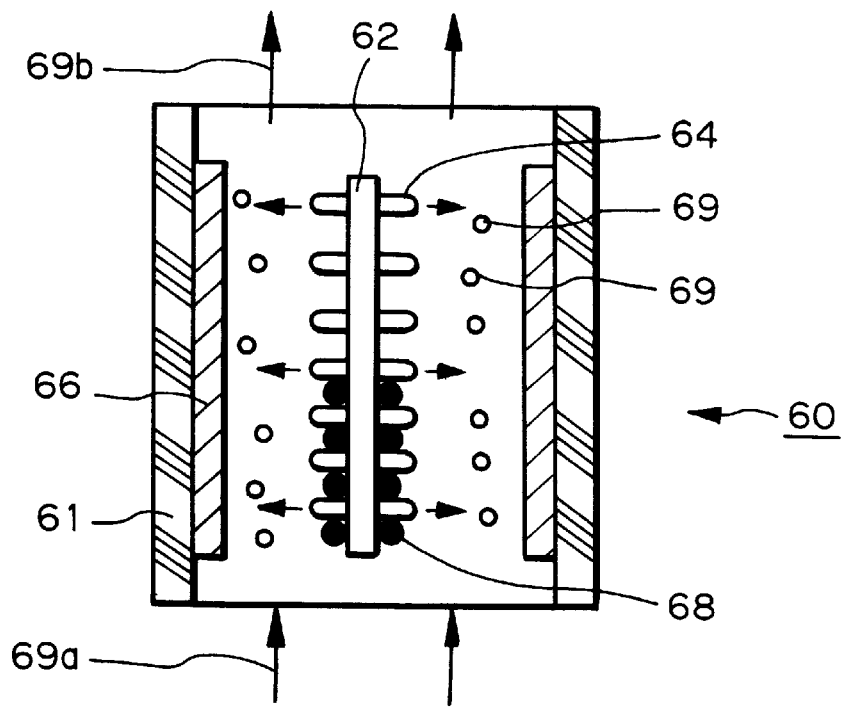
FIG. 6 is a cross section of the ionization device 60 in FIG. 5.

FIG. 6 is a cross section of the ionization device 6 The ionization device 60 has a housing 61 having a cylindrical configuration defining a bore extending along e axial direction. The housing 61 is preferably made of an electrical insulator. The housing 61 has an electrode 66, which may have a cylindrical configuration being complementary in shape to an inner surface of the housing 61.

The ionization device 60 has a support 62, which may have a bar configuration extending in an axial direction of the housing 61, and a plurality of needles 64 protruding from the support 62 in generally radial directions. The needles serve as discharge electrodes for corona discharge.

The ionization device 60 has a heater 68 for generating convection. The heater 68 rolls around the support 62 and being disposed between the needles 64. The heater 68 warms up a local air in the bore for flowing the local air upward through the bore so as to generate convection in the chamber 38. The convection carries the negatively charged ions in the bore of the housing 61 to the wafer 30, and carries the particles 34 removed from the surface 32 of the wafer to the bore of the housing 61. The housing 61 is preferably held in a vertical direction so as to facilitate the convection through the bore therein.

The corona voltage is applied to the discharge electrode 64, which serves as a cathode, and the electrode 66, which serves as an anode, so as to generate a corona discharge. As a result, a plurality of negatively charged ions and electrons are generated in the vicinity of the discharge electrodes 64, and a shower of the negatively charged ions and electrons are driven in a direction toward the electrode 66 by an electric field between the cathode 64 and the anode 66.

Preferably, during the corona discharge, the heater 68 is turned on so as to generate the convection for carrying a local gas containing the negatively charged ions in the bore of the housing to the top of the housing 61 and further to an area over the wafer 30. The negatively charged ions interact with the particles 34 on the surface 32 of the wafer 30 so as to ionize the particles 34.

The air knife 19 applies a gas stream being free of particle onto the surface 32 of the wafer 30 while an electric current is applied to the electrode 14 as a cathode and the electrode 66 as an anode so as to form an electric field for driving the electrically charged particles from the surface 32 of the wafer 30 to the electrode 66.

Preferably, the corona voltage may be further applied to the discharge electrode 64, which serves as a cathode, and the electrode 66, which serves as an anode, so as to generate a corona discharge. The negatively charged ions thus produced further supply negative charges with the floating particles removed from the surface 32, thereby facilitating the trapping by the electrode 66. During the corona discharge, preferably, the heater 68 is turned on so as to generate the convection for carrying an air containing the floating, negatively charged particles to the lower end of the bore of the housing 41, thereby facilitating the trap by the electrode 66.

Example 8

The chamber 38 containing the apparatus 11 of Example 6 in FIG. 4 was disposed in a clean room of class 10, and following experiments are carried out so as to confirm removal of particles from an article. The chamber had a volume of 30 liters.

A high purity silicon wafer having a diameter of five inches was used. Polystyrene latex, which may be referred to PSL, standard particles having an average dimension of 0.5 and 1.0 micrometers were placed on the silicon wafer 30 in two runs, respectively.

The ionization device 50 had a support 52 and a plurality of needles 54 serving as discharge electrodes. An electric field between the discharge electrodes 54 and the electrode 14 having a plate configuration was set to 2.5 kilovolts per centimeter.

After the corona discharge, an electric field of 300 volts per centimeter between the discharge electrode 54 as a cathode and the electrode 14 as an anode was applied for driving the negatively charged ions to the surface 32 of the wafer 30.

The ultrasonic generator 18 had a piezoelectric oscillator having 60 kHz.

An electric field of 100 volts per centimeter between the electrode 26 as an anode and the discharge electrode 54 as a cathode was applied for trapping floating, negatively charged particles by the electrode 26.

A dust detector for a wafer was used to determine the number of the particles made of polystyrene latex on a surface 32 of the wafer 30.

The number of particles on a surface 32 of the wafer are shown in Table 3 so as to show the removal of the particles.

TABLE 3

| Run No. | | 1 | 2 | 3 | 4 | 5 |
|---|---|---|---|---|---|---|
| ionization step | | done | none | done | none | none |
| ultrasonic step | | done | done | done | done | none |
| electric field step | | done | done | none | none | none |
| particle | 0.5 μm | 30 | 900 | 850 | 1000 | 1050 |
| size | 1.0 μm | 25 | 800 | 750 | 850 | 900 |

In Table 3, the ionization step refers to the corona discharge and the subsequent step of applying an electric field for driving the negatively charged ions to the surface of the substrate. The ultrasonic step refers to applying an ultrasonic wave to the surface 32 of the wafer 30 by the ultrasonic generator 18. The electric field step refers to forming an electric field between the electrode 54 and electrode 26 for driving charged particles 34 from the surface 32 of the wafer 30 while applying the ultrasonic wave. "Done" refers to that the step was carried out. "None" refers to that the step was not carried out. The number refers to the number of particles present on the top circular surface of the wafer having a diameter of 5 inches.

Example 9

Using the aforementioned apparatus 11 of Example 6, a further experiment was carried out for removal of floating particles originated from the particles 34 on the surface 32 of the wafer. The ionization step, the ultrasonic step and the electric field step of Example 8 were carried out in the same conditions in two runs. Polystyrene latex particles having an average dimension of 0.5 micrometers were used.

After the electric field step, in one of the runs, the ionization step was carried out again for a period of 30 minutes so as to facilitate removal of floating particles originated from the wafer surface by the electrode 26. In contrast, this ionization step was not carried out in the other run.

Subsequently, a particle-free nitrogen gas was introduced into the chamber 38 so as to purge the air therein, followed by determining the number of floating particles having a dimension of not less than 0.1 micrometers per square feet in the chamber 38 by a particle counter. The result is shown in Table 4.

TABLE 4

| ionization step | the number of the particles per square feet |
|---|---|
| done | 10 |
| none | 650–700 |

Example 10

Figure 7:
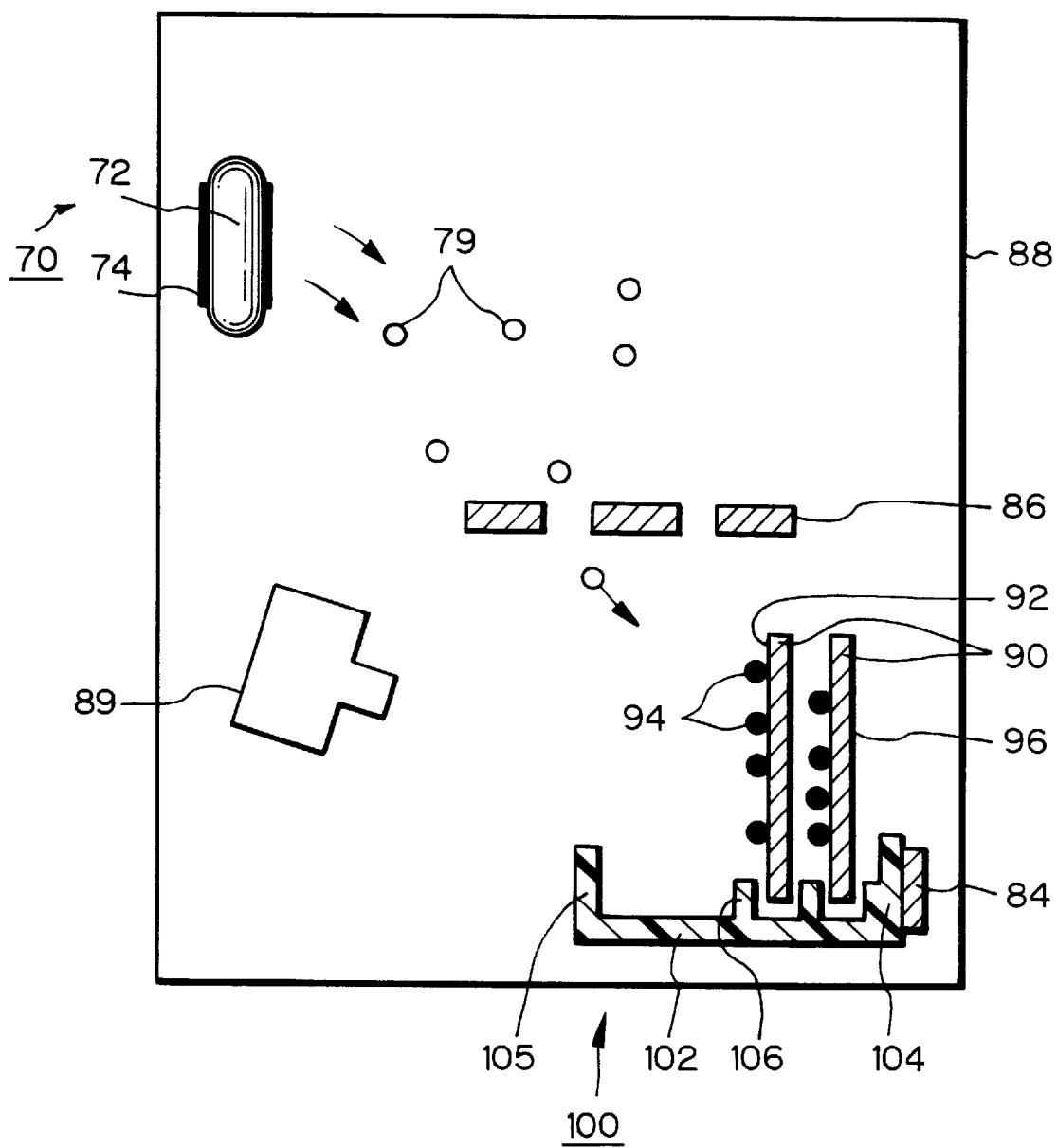
FIG. 7 is a schematic view of another embodiment in accordance with the present invention.

FIG. 7 is a schematic view of an apparatus of the present invention in a clean room. The apparatus is disposed in a chamber 88, which in turn is disposed in a clean room.

A rack 100 has a bottom portion 102, side walls 104, 105 being connected to the bottom portion 102, and a plurality of protrusions 106 for separating one wafer from another. The rack 100 may be made of a synthetic resin, such as polypropylene.

A wafer 90 having a plate configuration stands in generally transverse directions in the rack 100. The wafer 90 has a pair of main surfaces 92, 96, and a plurality of particles 94 are present on one of the main surfaces 92.

In FIG. 7, an electrode 84 is disposed on an outer surface of the side wall 104 so as to form an electric field between the electrode 74 and the electrode 84. The electrode 84 is disposed in the opposite side of the wafer 90 with respect to the particles 94. The electrode 74 is disposed in the same side of the wafer 90 with respect to the particles 94. The electrode 84 may be a metallic coating on the outer surface of the side wall 104.

An apparatus has a device 70 for emitting a photoelectron 79 toward the electrode 84. The device 70 has an ultraviolet lamp 72, a coating 74 on a surface of the ultraviolet lamp. The coating 74 is made of a photoelectron emitting material, and the coating 74 may serve as one of electrodes for forming an electric field for driving a photoelectron.

An apparatus 10 has an air knife 89 for applying a gas stream onto a surface 94 of the wafer 90. The air knife 89 may be disposed in the same side of the wafer with respect to the particles 94.

Another electrode 86 for trapping particles 94 removed from the wafer 90 is disposed between the ultraviolet lamp 72 and the electrode 84. The electrode 86 may have a grid configuration and extend in horizontal directions. The electrode 86 may be disposed above the rack 100.

In a method according to the present invention, the ultraviolet lamp 72 is turned on so as to irradiate an ultraviolet ray onto the coating 74 on the ultraviolet ramp 72, thereby emitting photoelectrons 79 from the coating 74. While photoelectrons 79 are generated from the coating 74, electric current is applied to the coating 74 serving as a cathode and the electrode 84 serving as an anode so as to form an electric field for driving the photoelectrons 79 from the coating 74 to the electrode 84. During the passage the photoelectrons 79 may interact with oxygen and water molecules in an atmosphere so as to produce negatively charged ions thereof. The negatively charged ions along with the photoelectrons 79 are driven toward the electrode 84 by the electric field. The negatively charged ions and/or photoelectrons 79 interact with particles 94 on a surface 92 of the wafer 90 so as to supply the particles with an electric charge.

Subsequently, electric current is applied to the electrode 84 and electrode 86 such that the electrode 84 and electrode 86 serve as a cathode and an anode, respectively, so as to form an electric field for driving the negatively charged particles 94 from the wafer 90 to the electrode 86. Please note that the polarity of the electrode 14 is changed from an anode and a cathode. Simultaneously, the air knife applies a gas stream onto the surface 92 of a wafer 90. Particles 94 are removed from the surface 92, and float over the wafer 90.

In the present invention, preferably the particles removed from the wafer 90 are further removed from a gas. The electrode 86 serving as the cathode may trap the floating particles. Preferably, the floating particles are further ionized to facilitate the trapping by the anode 86.

In the present invention, the combination of ultrasonic wave or a gas stream and an electric field enables to remove particles having a dimension smaller than 10 micrometers, particularly those smaller than 5 micrometers and even those having a dimension smaller than 1 micrometer. The presence of a collecting member allows to further remove the resulting, floating particles removed from the article.

What is claimed is:

1. A method for removing particles from a surface of an article comprising the steps of:

supplying the particles with an electric charge to produce electrically charged particles; and applying a gas stream onto the surface of the article while applying a first electric field for driving away the electrically charged particles from the surface of the article, wherein the supplying step comprises bombarding the surface of the article with at least one of electrons and negatively charged ions such that the particles are negatively charged, and wherein the supplying step comprises the step of irradiating at least one of an ultraviolet ray and a radiation ray onto a photoelectron emitting material in the presence of at least 1 part per million of one of gaseous oxygen and/or water so as to produce the negatively charged ions.

2. A method of claim 1, wherein the supplying step further comprises the step of applying a second electric field for driving the negatively charged ion in a direction toward the surface of the article, whereby the negatively charged ion interacts with the particles so as to supply the particles with the electric charge.

3. A method of claim 2, wherein the second electric field ranges from 0.1 volts to 2 kilovolts per centimeter.

4. A method of claim 2, wherein the second electric field ranges from 10 volt to 1 kilovolts per centimeter.

5. A method of claim 1, wherein convection generated by the irradiation of the ultraviolet ray carries the negatively charged ions to the particles on the surface of the article.

6. A method of claim 1, wherein the supplying step comprises the step of conducting electric discharge for producing a negatively charged ion.

7. A method of claim 6, wherein the supplying step further comprises the step of applying a second electric field for driving the negatively charged ion in a direction toward the surface of the article, whereby the negatively charged ion interacts with the particles so as to supply the particles with the electric charge.

8. A method of claim 6, wherein convection generated by the irradiation of the ultraviolet ray carries the negatively charged ions to the particles on the surface of the article.

9. A method of claim 1, further comprising the step of collecting the particles removed from the surface.

10. A method of claim 9, wherein the collecting step comprises the step of supplying the particles removed from the surface with at least one of electrons and negatively charged ions.

11. A method of claim 9, wherein the collecting step comprises the steps of:

irradiating at least one of an ultraviolet ray and a radiation ray onto the photoelectron emitting material in the presence of at least 1 part per million of one of gaseous oxygen and water so as to produce a negatively charged ion; and applying a second electric field for driving the negatively charged ion in a direction toward the surface of the article.

12. A method of claim 9, wherein the collecting step comprises the step of conducting electric discharge for producing a negatively charged ion.

13. A method of claim 1, wherein particles having a dimension not more than 5 micrometers are removed from the surface of the article.

14. A method of claim 1, wherein particles having a dimension not more than 1 micrometer are removed from the surface of the article.

15. A method of claim 1, wherein the particles have a dimension of at least 0.1 micrometer.

16. A method of claim 1, wherein the article comprises a semiconductor wafer being disposed above a first electrode.

17. A method of claim 1, wherein the article comprises a semiconductor wafer standing and being close to a first electrode.

18. A method of claim 1, wherein the first electric field ranges from 10 volts to 100 kilovolts per centimeter.

* * * * *